(12) United States Patent
Nomura et al.

(10) Patent No.: US 10,498,263 B2
(45) Date of Patent: Dec. 3, 2019

(54) DEVICE AND METHOD FOR CONTROLLING LINEAR MOTOR

(71) Applicant: THK CO., LTD., Tokyo (JP)

(72) Inventors: Yuki Nomura, Tokyo (JP); Takeo Karaushi, Tokyo (JP); Hideya Nakayama, Tokyo (JP); Tsuyoshi Inda, Tokyo (JP)

(73) Assignee: THK CO., LTD., Tokyo (JP)

( * ) Notice: Subject to any disclaimer, the term of this patent is extended or adjusted under 35 U.S.C. 154(b) by 0 days.

(21) Appl. No.: 16/063,863

(22) PCT Filed: Dec. 21, 2016

(86) PCT No.: PCT/JP2016/088096
§ 371 (c)(1),
(2) Date: Jun. 19, 2018

(87) PCT Pub. No.: WO2017/110875
PCT Pub. Date: Jun. 29, 2017

(65) Prior Publication Data
US 2018/0375447 A1   Dec. 27, 2018

(30) Foreign Application Priority Data
Dec. 25, 2015 (JP) .................................. 2015-253084

(51) Int. Cl.
*H02P 6/00* (2016.01)
*H02P 6/24* (2006.01)
(Continued)

(52) U.S. Cl.
CPC .............. *H02P 6/006* (2013.01); *B65G 47/91* (2013.01); *H01L 21/67144* (2013.01);
(Continued)

(58) Field of Classification Search
CPC ................................... H02P 6/006; H02P 6/08
(Continued)

(56) References Cited

U.S. PATENT DOCUMENTS

| 4,999,558 A * | 3/1991 | Onodera | ................ G05B 19/39 |
| | | | 318/685 |
| 8,786,219 B2 * | 7/2014 | Ikeda | .................... H02P 29/032 |
| | | | 242/334.1 |

(Continued)

FOREIGN PATENT DOCUMENTS

| CN | 1065562 A | 10/1992 |
| CN | 102859865 A | 1/2013 |

(Continued)

OTHER PUBLICATIONS

International Search Report dated Apr. 4, 2017, issued in counterpart International Application No. PCT/JP2016/088096, w/English translation (3 pages).

(Continued)

*Primary Examiner* — David Luo
(74) *Attorney, Agent, or Firm* — Westerman, Hattori, Daniels & Adrian, LLP

(57) ABSTRACT

A control device for a linear motor includes a speed controller that calculates a current command value by an integration operation using a first integral value of a difference between a moving speed of a movable element provided in the linear motor and a speed command value calculated on the basis of a position command value, a current controller that applies a voltage to the linear motor on the basis of the current command value, and a correction value storage unit that stores the first integral value of the speed controller when the movable element remains at a position indicated by the position command value. When resuming control of the linear motor, the speed controller sets the first integral value stored in the correction value (Continued)

storage unit as an initial value for the integration operation before the brake controller turns off the brake device.

4 Claims, 7 Drawing Sheets

(51) Int. Cl.
    *H02P 6/17*     (2016.01)
    *H02P 6/28*     (2016.01)
    *B65G 47/91*     (2006.01)
    *H01L 21/67*     (2006.01)
    *H02P 6/08*     (2016.01)

(52) U.S. Cl.
    CPC ............... *H02P 6/08* (2013.01); *H02P 6/17* (2016.02); *H02P 6/24* (2013.01); *H02P 6/28* (2016.02)

(58) Field of Classification Search
    USPC .................................................. 318/135, 34
    See application file for complete search history.

(56) References Cited

U.S. PATENT DOCUMENTS 8,994,298 B2 * 3/2015 Inaji ..................... H02P 23/18
                                                                           318/135
2013/0038781 A1     2/2013 Inaji et al.

FOREIGN PATENT DOCUMENTS

| | | |
|---|---|---|
| JP | 2000-75930 A | 3/2000 |
| JP | 2003-304695 A | 10/2003 |
| JP | 2006-67749 A | 3/2006 |
| WO | 2012/114770 A1 | 8/2012 |

OTHER PUBLICATIONS

Office action dated Jun. 24, 2019, issued in counterpart CN application No. 201680068229.6, with English translation. (14 pages).

* cited by examiner

DEVICE AND METHOD FOR CONTROLLING LINEAR MOTOR

TECHNICAL FIELD

The present invention relates to a control device and a control method for a linear motor.

Priority is claimed on Japanese Patent Application No. 2015-253084, filed Dec. 25, 2015, the content of which is incorporated herein by reference.

BACKGROUND ART

A machine tool such as a chip mounter for attaching workpieces to a substrate is used to mount workpieces such as electronic components on a substrate. In the machine tool, a servo-controlled linear motor is used for movement in the vertical direction when attaching a workpiece to a substrate. With the linear motor that moves a movable element in the vertical direction, there is a possibility that, when the servo control starts, the movable element may drop due to gravity such that it is displaced from a target position. There is a technology which prevents displacement of the movable element due to an external force such as gravity at the start of servo control or the like by generating a thrust force for correcting a current that flows through a motor to cancel out the external force (Patent Literature 1).

CITATION LIST

Patent Literature

[Patent Literature 1]
Japanese Unexamined Patent Application, First Publication No. 2000-075930

SUMMARY OF INVENTION

Technical Problem

However, if the current value is corrected so as to generate a thrust force in a direction in which to cancel out the external force, a thrust force for moving the movable element in the direction in which the external force acts is reduced and there is a possibility that the response of the linear motor may be delayed.

The present invention provides a control device and a control method for a linear motor which can improve responsiveness.

Solution to Problem

According to a first aspect of the present invention, a control device for a linear motor includes a speed controller, a current controller, and a correction value storage unit. The speed controller is configured to calculate a current command value by an integration operation using a first integral value of a difference between a moving speed of a movable element provided in the linear motor and a speed command value calculated on the basis of a position command value. The current controller is configured to apply a voltage to the linear motor on the basis of the current command value. The correction value storage unit is configured to store the first integral value of the speed controller when the movable element remains at a position indicated by the position command value. The speed controller is configured to set the first integral value stored in the correction value storage unit as an initial value for the integration operation when resuming control of the linear motor.

According to a second aspect of the present invention, the speed controller may be configured to set the first integral value stored in the correction value storage unit as an initial value for the integration operation when changing a direction in which to move the movable element.

According to a third aspect of the present invention, the control device further includes a brake controller configured to control a brake device configured to brake the movable element of the linear motor. The speed controller may be configured to set the first integral value stored in the correction value storage unit as an initial value for the integration operation when resuming control of the linear motor before the brake controller turns off the brake device.

According to a fourth aspect of the present invention, the current controller may be configured to calculate a voltage value to be applied to the linear motor by an integration operation using a second integral value of a difference between the current command value and a current value flowing in the linear motor. The correction value storage unit may be configured to store the second integral value of the current controller when the movable element remains at a position indicated by the position command value. The current controller may be configured to set the second integral value stored in the correction value storage unit as an initial value for the integration operation when resuming control of the linear motor.

According to a fifth aspect of the present invention, the current controller may be configured to set the second integral value stored in the correction value storage unit as an initial value for the integration operation when changing a direction in which to move the movable element.

According to a sixth aspect of the present invention, a control method that a control device performs for a linear motor, the control device including a speed controller configured to calculate a current command value by an integration operation using a first integral value of a difference between a moving speed of a movable element provided in the linear motor and a speed command value calculated on the basis of a position command value, and a current controller configured to apply a voltage to the linear motor on the basis of the current command value, the method includes a first step storing the first integral value of the speed controller when the movable element remains at a position indicated by the position command value, and a second step setting the stored first integral value as an initial value for the integration operation in the speed controller when resuming control of the linear motor.

Advantageous Effects of Invention

According to the control device and the control method for the linear motor described above, it is possible to improve responsiveness in controlling the linear motor.

DESCRIPTION OF EMBODIMENTS

Figure 1:
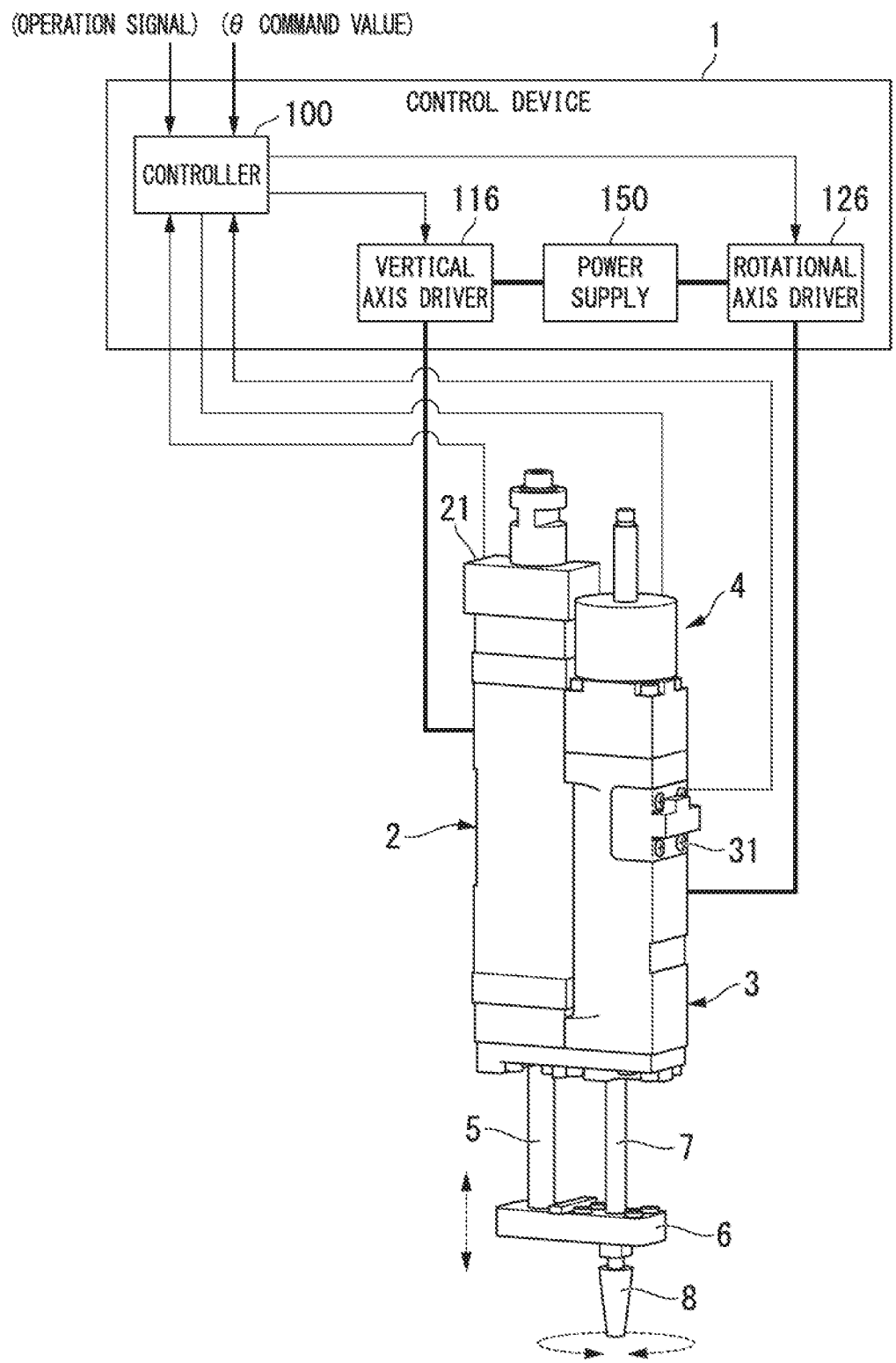
FIG. 1 is a diagram showing an outline of a linear actuator in an embodiment of the present invention.

Hereinafter, a control device and a control method for a linear motor in an embodiment of the present invention will be described with reference to the drawings. FIG. 1 is a diagram showing an outline of a linear actuator in the present embodiment. The linear actuator is used, for example, as a transport device, a pick-and-place device, or a semiconductor processing device. The linear actuator has a control device 1, a linear motion device 2, a rotation device 3, and a brake device 4.

The linear motion device 2 has a linear motor. The linear motion device 2 linearly moves a rod 5 which is a movable element of the linear motor. A connecting plate 6 is fixed to a tip of the rod 5. The rotation device 3 has a rotary motor. The rotation device 3 rotates a rod 7, which is a movable element of the rotary motor, about a central axis of the rod 7. The rod 7 is rotatable connected to the connecting plate 6 via a bearing (not shown) provided in the connecting plate 6. The rod 7 is supported by a spline device (linear guide device) (not shown) provided inside the rotation device 3. The rod 7 is rotatable and linearly movable.

A suction pad 8 is attached to a tip of the rod 7 as an application device. Instead of the suction pad 8, another tool may he attached to the tip of the rod 7.

For example, the suction pad 8 sucks a workpiece using a negative pressure generated by an external device and detaches the workpiece therefrom using a positive pressure generated by the device. The suction pad 8 is moved in an axial direction along the central axis of the rod 7 by the linear motion device 2. That is, when the rod 5 is moved in the axial direction of the rod 5 by the linear motion device 2, the rod 7 is moved in the axial direction together with the rod 5 by the connecting plate 6, thus changing the position of the suction pad 8 in the axial direction of the rod 7.

The brake device 4 stops movement of the rod 7 in the axial direction. The brake device 4 of the present embodiment is attached to the rotation device 3. In the present embodiment, the axial direction of the rod 5 and the axial direction of the rod 7 are parallel and coincide with the direction of gravity. The linear actuator in the present embodiment is used, for example, in a Chip mounter. The chip mounter moves the suction pad 8 up and down using the linear motion device 2, thereby repeatedly performing tasks of picking up an electronic component or the like as a workpiece and pressing the electronic component to a predetermined position on a substrate. Before pressing the electronic component to a predetermined position on the substrate, the rotation device 3 rotates the suction pad 8 about the axial direction of the rod 7 according to the mounting direction of the electronic component on the substrate.

The control device I controls the linear motor of the linear motion device 2, the rotary motor of the rotation device 3, and the brake device 4. The control device 1 generates an electromagnetic field by causing a three-phase armature current to flow through U, V, and W phase coils provided in the linear motor, thereby linearly moving the rod 5, which is a movable element of the linear motor, with respect to a stator thereof. The control device 1 supplies a three-phase armature current to the linear motor on the basis of an input operation signal. Further, the control device 1 rotates the rotary motor on the basis of an input θ command value, thereby moving the angle of the rotational position of the rod 7 with respect to a reference position to an angle indicated by the θ command value.

The control device 1 includes a controller 100, a vertical axis driver 116, a rotational axis driver 126, and a power supply 150. The controller 100 calculates current command value on the basis of the operation signal and a vertical pulse signal output from an encoder 21 attached to the linear motion device 2. The controller 100 outputs the calculated current command value to the vertical axis driver 116. The vertical axis driver 116 converts voltage provided from the power supply 150 on the basis of the current command value and applies the converted voltage to the linear motor. The controller 100 drives the linear motor by supplying electric power to the linear motor via the vertical axis driver 116, thereby moving the suction pad 8 up and down.

The controller 100 calculates a current command value on the basis of the θ command value and a rotation pulse signal output from the encoder 31 attached to the rotation device 3. The controller 100 outputs the calculated current command value to the rotational axis driver 126. The rotational axis driver 126 converts a constant voltage provided front the power supply 150 on the basis of the current command value and applies the converted voltage to the rotary motor. The controller 100 drives the rotary motor by supplying electric power to the rotary motor via the rotational axis driver 126, thereby rotating the rod 7 and the suction pad 8.

Figure 2:
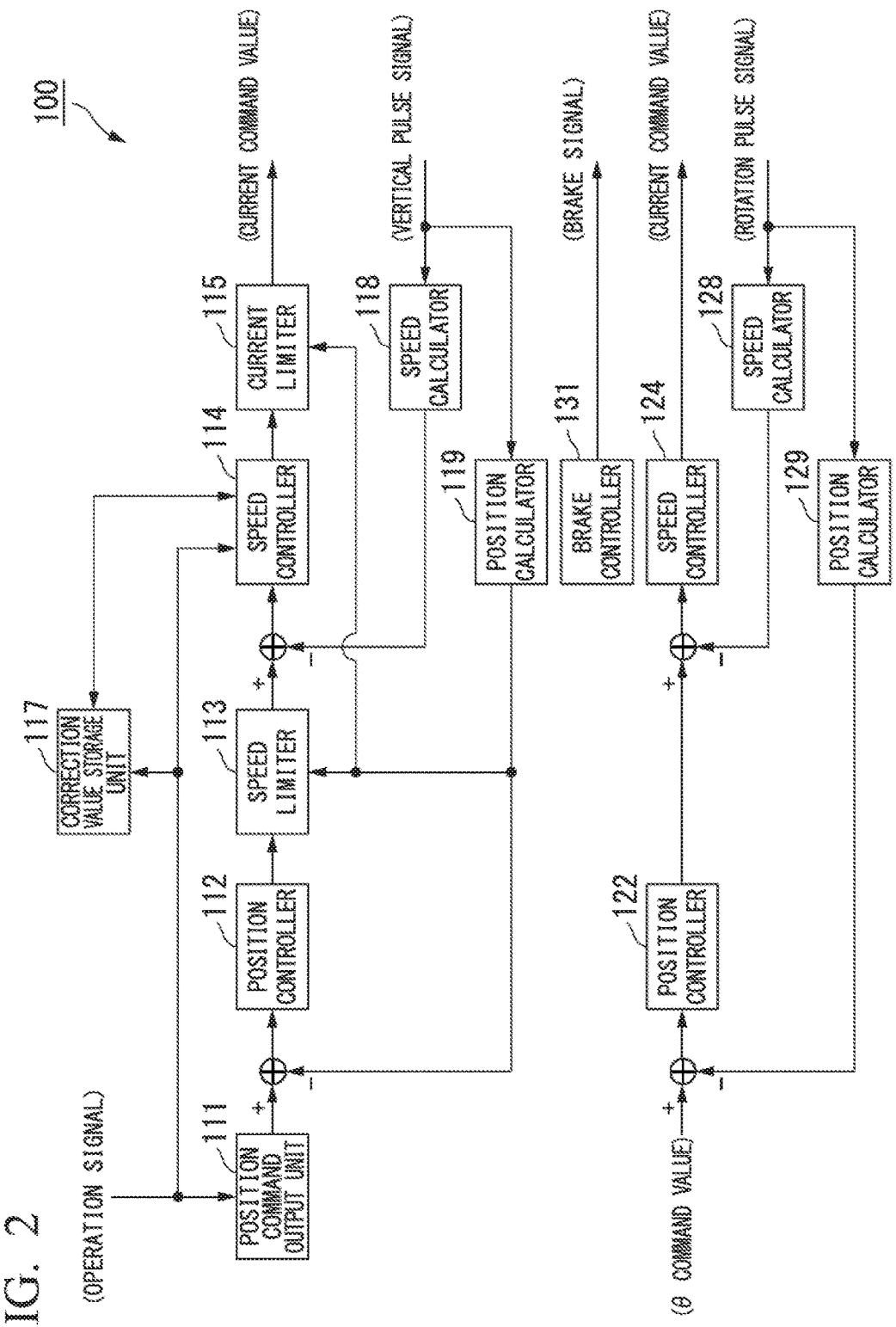
FIG. 2 is a block diagram showing an exemplary configuration of a controller in the embodiment of the present invention.

FIG. 2 is a block diagram showing an exemplary configuration of the controller 100 in the present embodiment. The controller 100 includes a position command output. unit 111, a position controller 112, a speed limiter 113, a speed controller 114, a current limiter 115, a correction value storage unit 117, a speed calculator 118, a position calculator 119, a position controller 122, a speed controller 124, a speed calculator 128, a position calculator 129, and a brake controller 131.

The position command output unit 111 outputs a position command value having one of an origin position and a pressing position as a target position in accordance with an input operation signal. The origin position is determined, for example, as an uppermost position of the rod 5 of the linear motor or as a position thereof which is determined as being near the uppermost position. The pressing position is determined as the position of the rod 5 of the linear motor when the workpiece is pressed against the substrate in a state where the workpiece is held by the suction pad 8. For example, the position command output unit 111 outputs a position command value having the origin position as a target position when the operation signal indicates movement to the origin position and outputs a position command value having the pressing position as a target position when the operation signal indicates movement to the pressing position. In the following description, the operation signal is described as being off when the operation signal indicates movement to the origin position and as being on when the operation A position deviation is input to the position controller 112. The position deviation is the difference between the position command value output by the position command output unit 111 and the position of the rod 5 calculated by the position calculator 119. The position controller 112 calculates a target speed of the rod 5 by PI control or PID control using the input position deviation. The position controller 112 outputs the calculated target speed as a speed command value.

When the absolute value of the speed command value calculated by the position controller 112 exceeds a predetermined upper limit value, the speed limiter 113 reduces and outputs the speed command value. There are two upper limit values, a first upper limit value and a second upper limit value. The first upper limit value is an upper limit value which is applied when the rod 5 moves between the origin position and a switching position and is a highest speed at which the rod 5 of the linear motor can be driven. The second upper limit value is an upper limit value which is applied when the rod 5 moves between the switching position and the pressing position and is a speed at which a force applied to the workpiece when the suction pad 8 contacts the workpiece and when the workpiece held by the suction pad 8 contacts the substrate is equal to or less than a certain level. The speed limiter 113 switches between the first upper limit value and the second upper limit value on the basis of the position of the rod 5 calculated by the position calculator 119.

Here, the switching position is a position for switching between the position control and the thrust force control that is a predetermined position between the origin position and the pressing position, which is determined according to a distance required to decrease the speed of the rod 5 from the highest speed to a speed indicated by the second upper limit valve. The position control is performed on the basis of the deviation between the target position and the position of the rod 5. The thrust force control is performed by limiting a thrust force generated by the linear motor to a thrust force equal to or smaller than a certain value. It is to be noted that the switching position when the rod 5 moves upward may stiffer from that when the rod 5 moves down ward.

A speed deviation is input to the speed controller 114. The speed deviation is the difference between the speed command value output by the speed limiter 113 and the speed of the rod 5 calculated by the speed calculator 118. The speed controller 114 calculates a target current value that is to flow in the linear motor by PI control using the input speed deviation. The speed controller 114 obtains the target current value by summing a value obtained by multiplying n integral value (a first integral value) of the speed deviation by an integral gain Ki and a value obtained by multiplying the speed deviation by a proportional gain Kp. That is, the speed controller 114 performs feedback control that combines a proportional operation for changing the current value in proportion to the speed deviation and an integration operation for changing the current value in proportion to the integral value of the speed deviation. Here, PID control further combining a differentiation operation for changing the current value in proportion to a differential value of the speed deviation may also be used for the calculation of the target current value by the speed controller 114.

In the thrust force control, the current limiter 115 reduces and outputs the current command value when the absolute value of the current command value calculated by the speed controller 114 exceeds a predetermined threshold current value. Similar to the second upper limit value for the speed command value, the threshold current value is determined as a current value at which a force applied to the workpiece when the suction pad 8 contacts the workpiece and when the workpiece held by the suction pad 8 contacts the substrate is equal to or less than a certain level. During other than the thrust force control, the current limiter 115 outputs the current command value calculated by the speed controller 114 to the vertical axis driver 116 without change as a current command value.

The correction value storage unit 117 acquires an integral value of the speed deviation in the speed controller 114 when the rod 5 remains at the origin position due only to the thrust force of the linear motor when driving of the linear motor starts and stores the acquired integral value as a correction value. The correction value storage unit 117 outputs the stored correction value to the speed controller 114 when driving of the linear motor resumes and when the rod 5 is moved from the pressing position to the origin position upon completion of the pressing of the workpiece. The speed controller 114 performs an integration operation using the integral value output from the correction value storage unit 117 as an initial value.

The speed calculator 118 calculates a speed at which the rod 5 moves on the basis of the vertical pulse signal output from the encoder 21 provided in the linear motor of the linear motion device 2. The position calculator 119 calculates the position of the rod 5 on the basis of the vertical pulse signal. Either an incremental type or an absolute type may be used for the encoder 21. When the encoder 21 is of the incremental type, a (reference position) is performed after driving of the linear motor starts.

The brake controller 131 turns on the brake device 4 to prevent the rod 5 from moving to the lowest point due to gravity or moving due to an external force until driving of the linear motor starts after the end of the driving. The brake controller 131 turns off the brake device 4 when servo control based on the position command value starts.

A rotational position deviation is input to the position controller 122. The rotational position deviation is the difference between a rotational position indicated fry the input θ command value and the rotational position of the rod 7 calculated by the position calculator 129. The position controller 122 calculates a target rotation speed of the rod 7 by PI control or PID control using the input position deviation. The position controller 122 outputs the calculated target rotation speed as a speed command value.

A rotation speed deviation is input to the speed controller 124. The rotation speed deviation is the difference between the speed command value calculated by the position controller 122 and the rotation speed of the rod 7 calculated by the speed calculator 128. The speed controller 124 calculates a target current value by PI control or PID control using the input rotational speed deviation. The speed controller 124 outputs the calculated target current value to the rotational axis driver 126 as a current command value.

The speed calculator 128 calculates a speed at which the rod 7 rotates on the basis of the rotation pulse signal output from the encoder 31 provided. in the rotary motor of the rotation device 3. The position calculator 129 calculates the rotational position of the rod 7 on the basis of the rotation pulse signal. Either an incremental type or an absolute type may be used for the encoder 31. When the encoder 31 is of the incremental type, a return-to-origin operation for rotating the rod 7 to a predetermined origin position (reference rotational position) is performed after driving of the linear motor starts.

Figure 3:
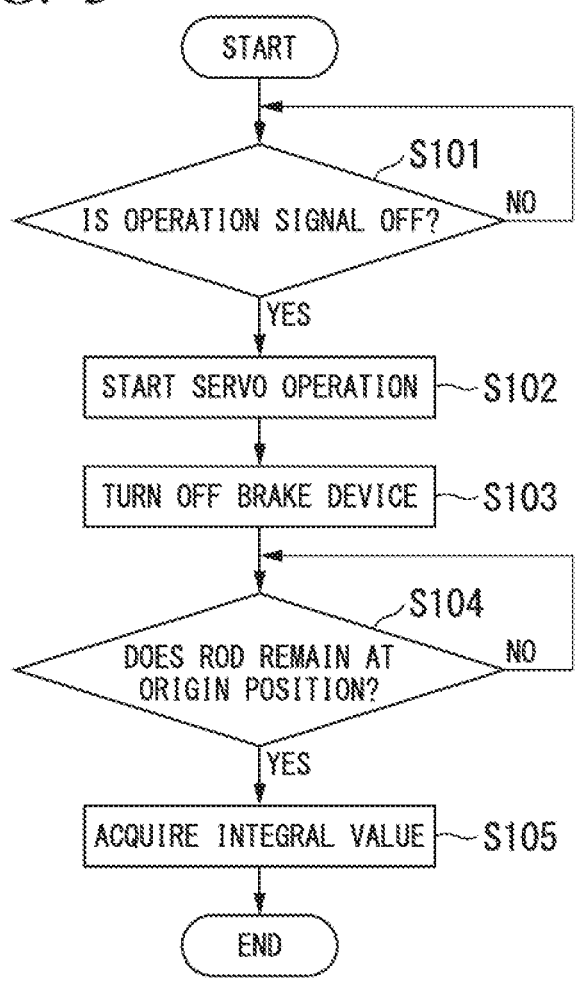
FIG. 3 is a flowchart showing processing of the controller when a correction value storage unit acquires a correction value.

FIG. 3 is a flowchart showing processing of the controller 100 when the correction value storage unit 117 acquires the correction value. When acquisition of the correction value starts in the controller 100, the position command output unit 111 determines whether or not the operation signal is off (step S101) and waits until the operation signal is turned off (step S101: NO). When the operation signal is turned off (step S101: YES), the position command output unit 111 outputs a position command having the origin position as a target position and starts a servo operation of the linear motor (step S102).

When the servo operation of the linear motor starts, the brake controller 131 turns off the brake device 4 to stop braking of the rod 7 (step S103). On the basis of the position of the rod 5 calculated by the position calculator 119, the correction value storage unit 117 determines whether or not the rod 7 remains at the origin position (step S104) and waits until the rod 5 remains at the origin position (step S104: NO). When the rod 5 remains at the origin position (step S104: YES), the correction value storage unit 117 acquires the integral value of the speed deviation in the speed controller 114 and stores the acquired integral value as a correction value (step S105), and ends the acquisition of the correction value.

In the determination in step S104, it is determined that the rod 5 remains at the origin position, for example, when the position of the rod 5 calculated by the position calculator 119 is located at the origin position for a predetermined period. It may also be determined that the rod 5 remains at the origin position when the position of the rod 5 is located within a predetermined range including the origin position for a predetermined period.

Figure 4:
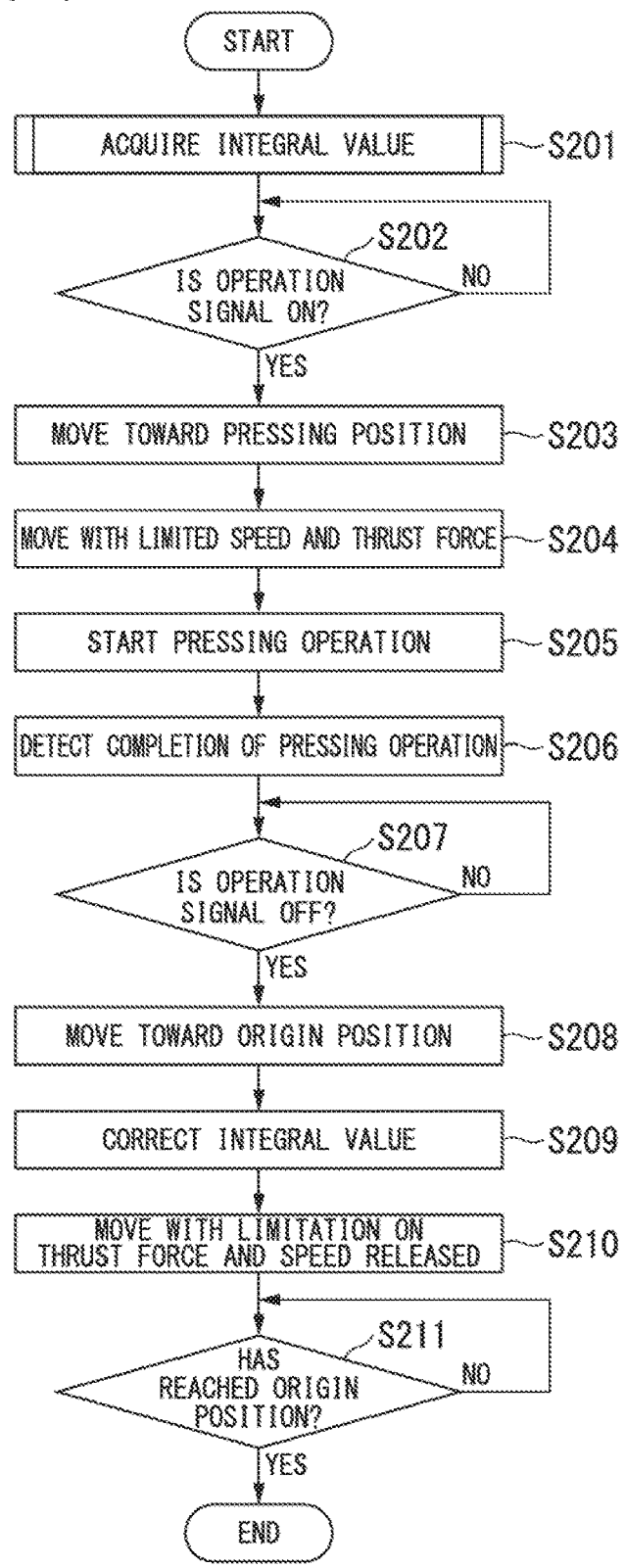
FIG. 4 is a flowchart showing control when performing an operation for picking up a workpiece or pressing the workpiece against a substrate using a linear actuator.

FIG. 4 is a flowchart showing control when performing an operation for picking up a workpiece or pressing the workpiece against the substrate using the linear actuator. When the linear actuator starts operation, for example, as electric power is supplied to the linear actuator, the controller 100 performs a process of acquiring the integral value shown in FIG. 3 (step S201), The position command output unit 111 determines whether or not the operation signal is on (step S202) and waits until the operation signal is turned on (step S202: NO).

When the operation signal is turned on (step S202: YES), the position command output unit 111 outputs a position command value having the pressing position as a target position and starts an operation of moving the rod 5 downward toward the pressing position (step S203). The speed limiter 113 and the current limiter 115 reduces the speed command value and the current command value when the rod 5 has moved downward beyond the position for switching from position control to thrust force control. By reducing the speed command value and the current command value, control is performed with the moving speed of the rod 5 and the thrust force applied to the rod 5 being limited (step S204).

The pressing operation starts when it is detected by a change in the current value provided to the linear motor and the moving speed and the position of the rod 5 that the suction pad 8 has contacted the workpiece or the workpiece held by the suction pad 8 has contacted the substrate as the rod 5 is moved downward by thrust force control such that the rod 7 and the suction pad 8 move together with the rod 5 (step S205). When a predetermined time has elapsed after the start of the pressing operation, completing the pressing operation (step S206), the position command output unit 111 determines whether or not the operation signal is off (step S207) and waits until the operation signal is turned off (step S207: NO). Here, the time elapsed after the start of the pressing operation may be measured using a timer provided in the controller 100 or may be acquired from an external device after notifying the external device of the start of the pressing operation.

When the operation signal is turned off (step S207: YES), the position command output unit 111 outputs a position command value having the origin position as a target position and starts turn operation of moving the rod 5 upward (step S208). At this time, the correction value storage unit 117 outputs the stored correction value to the speed controller 114 in response to the change of the operation signal from on to off to change to the integral value of the integration operation in the speed controller 114 to the correction value (step S209).

The speed limiter 113 and the current limiter 115 stops limiting the speed command value and the current command value when the rod 5 has moved upward beyond the position for switching from thrust three control to position control. Thus, control is performed with the limitation an the moving speed of the rod 5 and the thrust force applied to the rod 5 released (step S210).

The rod 5 is moved upward by the position control and the position controller 112 determines whether or not the rod 5 has reached the origin position (step S211) and waits until the rod 5 reaches the origin position (step S211: NO), When the rod 5 has reached the origin position (step S211: YES), the operation ends. When the operation. ends, the rod 5 is held at the origin position by servo control of the controller 100.

When the same operation is repeatedly performed, the same process as that of step S209 is performed in the second and subsequent operations, without performing the process of acquiring the integral value in step S201. Specifically, the speed controller 114 starts processing using the correction value output from the correction value storage unit 117 as an initial value of the integral value in the integration operation. At this time, when the brake device 4 is on, the speed controller 114 changes the integral value in the integration operation to the correction value before the brake controller 131 turns off the brake device 4.

When general servo control starts to turn off the brake device 4, which has stopped the rod 5 near the origin position, to position the rod 5 at the origin position, the current command value becomes small since the position deviation and the speed deviation are small. Therefore, immediately after the servo control starts, the current flowing in the linear motor is small, a thrust force for holding the rod 5 cannot be obtained, and there is a possibility that the rod 5 may drop due to an external force such as gravity such that it is displaced from the origin position. Upon starting the servo control for the linear motor to he operated in the vertical direction, the controller 100 of the present embodiment turns off the brake device 4 that brakes the rod 5 which is the movable element of the linear motor. At this time, in the controller 100, the speed controller 114 calculates a current command value after updating the integral value in the integration operation with the correction value stored in the correction value storage unit 117. The correction value is an integral value acquired by the processing shown in FIG. 3, which is an integral value of the speed controller 114 at which the linear motor generates a thrust force whereby the rod 5 remains at the target position. That is, the correction value is an integral value that generates a thrust force for holding the rod 5 at the target position in a state where there is almost no position deviation.

By changing the initial value of the integral value in the integration operation performed by the speed controller 114 to the correction value, it is possible to allow the linear motor to generate a thrust force for holding the rod 5. Since the thrust force for holding the rod 5 is obtained, it is possible to prevent the rod 5 from dropping due to an external force such as gravity such that it is displaced from the origin position even when the brake device 4 is turned off. By suppressing the positional displacement of the rod 5 immediately after starting the servo control, it is possible to improve the responsiveness of the linear motor immediately after starting the servo control in addition, in the servo control performed by the controller 100, control for correcting the current value such that the external force is canceled out is not performed, and therefore the responsiveness can be improved without deteriorating the responsiveness and operating speed of the linear motor. Thus, according to the controller 100, the responsiveness of the linear motor can be improved even when an external force is generated.

Further, in the linear actuator in the present embodiment, it is required that the time (takt time) required to pick up the workpiece or to attach the workpiece to the substrate be shortened. An operation pattern is used in which the rod 5 is moved at a high speed when it is moved downward and is decelerated immediately before it contacts the workpiece or before the workpiece held by it contacts the substrate.

When the rod 5 is moved upward, it is moved at a high speed to shorten the time required to return to the origin position. When moving the rod 5 upward, it is possible to change the moving speed to the highest speed in a short time by increasing the proportional gain Kp of the proportional operation in the position controller 112 and the speed controller 114.

Since the rotational position of the rotary motor of the rotation device 3 is fixed at a rotational position indicated by the θ command value, the control device 1 is configured so as not to cause a displacement in the rotational position of the rod 7 and the suction pad 8 when raising the rod 5 from the pressing position at a low speed. However, when raising the rod 5 at a high speed, the control of the control device 1 for the rotary motor cannot keep up with the change in the rotational position of the rod 7 and the suction pad 8, causing a displacement in the rotational position of the rod 7 and the suction pad 8. Therefore, raising the rod 5, the rod 7, and the suction pad 8 at a high speed to further shorten the takt time is problematic.

In the controller 100 of the present embodiment, when the rod 5 is moved upward after the pressing operation is completed, the speed controller 114 calculates the current command value after updating the integral value in the integration operation with the correction value stored in the correction value storage unit 117. As described above, the correction value is an integral value that generates a thrust force for holding the rod 5 at the target position in a state where there is almost no position deviation. When the pressing operation is completed, the current value calculated with the integration operation is a current value for generating a downward thrust force to calculate a current command value for moving the rod 5 downward. Therefore, the controller 100 changes the integral value to the correction value at the timing when the operation signal is turned off such that upward movement toward the origin position starts. Thereby, it is possible to eliminate the cause of generating the downward thrust force, to allow the linear motor to promptly generate an upward thrust force, to improve the responsiveness of the linear motor, and to shorten the takt time.

Furthermore, when the suction pad 8 and the workpiece are positioned separated from each other as the rod 5 moves upward, the controller 100 shifts to control for releasing the limitation on the moving speed of the rod 5 and the thrust force applied to the rod 5 and therefore it is possible to move the rod 5 and the suction pad 8 upward at a high speed, without displacing the position of the workpiece, and to shorten the takt time.

Figure 5:
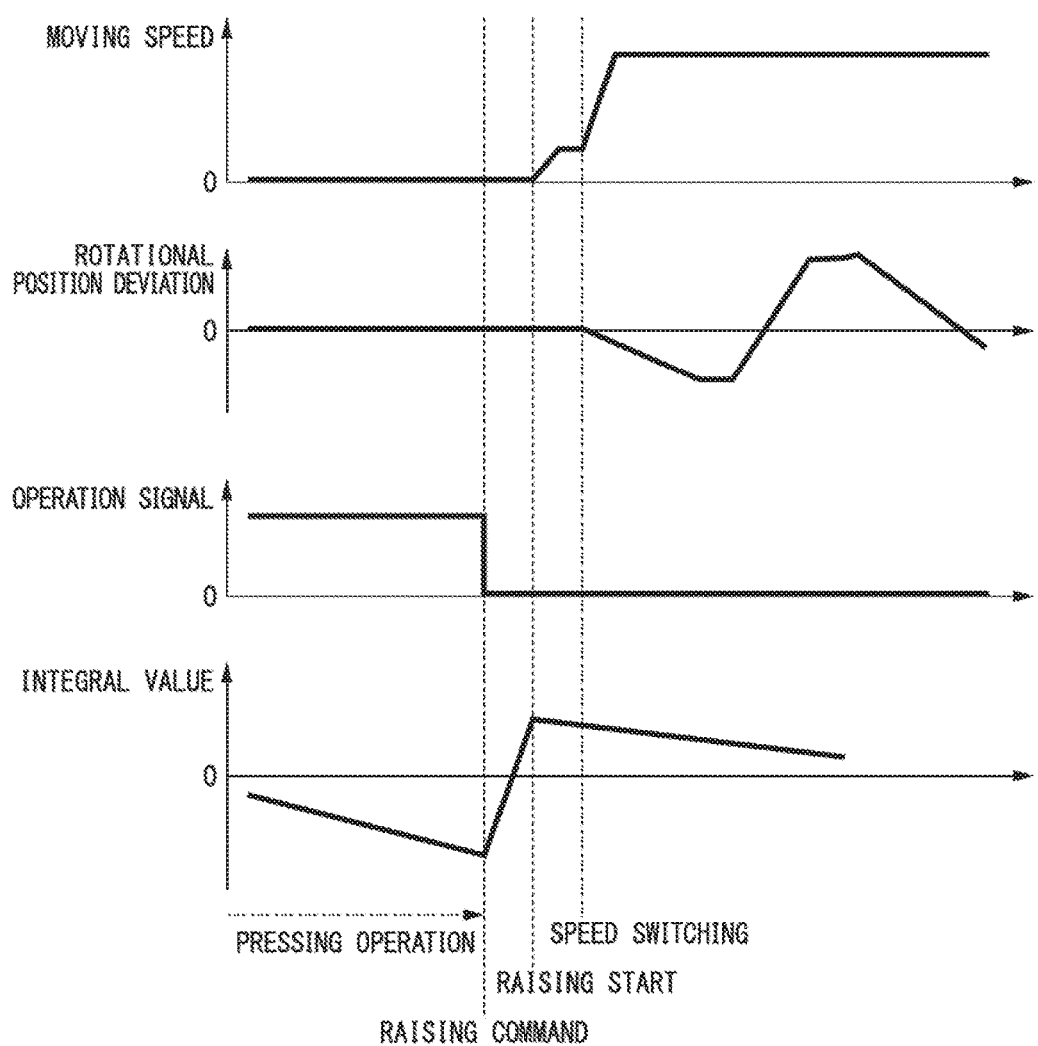
FIG. 5 is a diagram showing an exemplary operation in a first comparative example.
Figure 6:
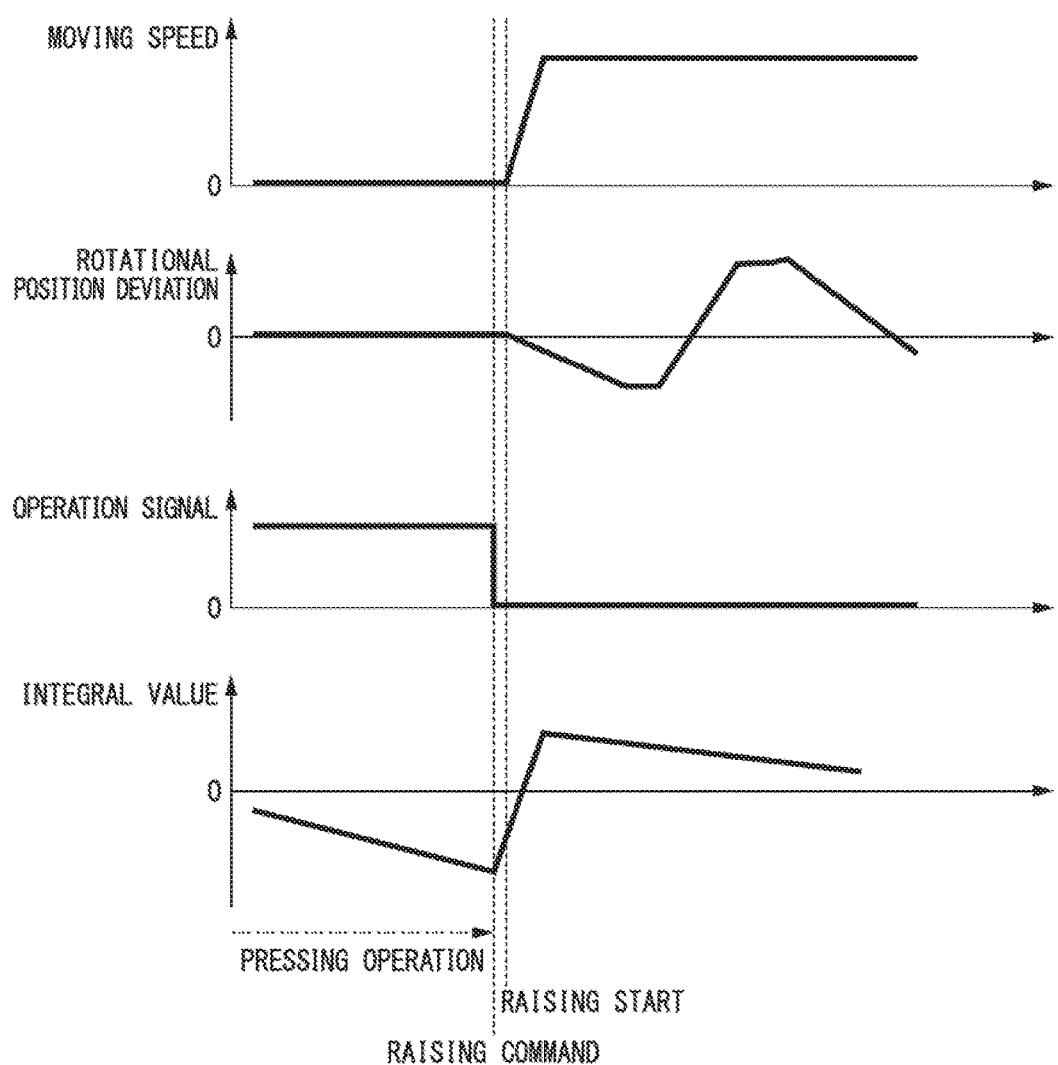
FIG. 6 is a diagram showing an exemplary operation in a second comparative example.
Figure 7:
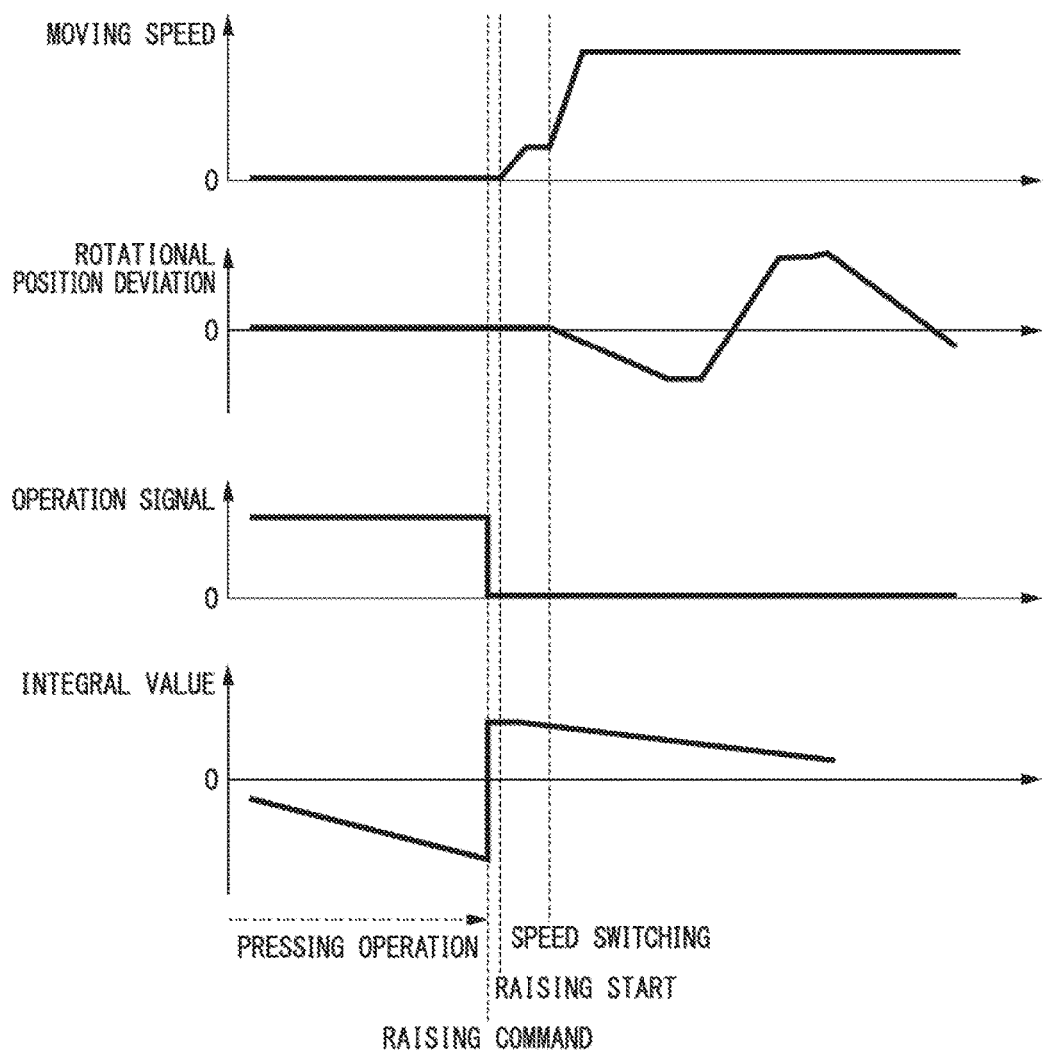
FIG. 7 is a diagram showing an exemplary operation in the embodiment of the present invention.

An operation of moving the rod 5 upward after the completion of the pressing operation in the linear actuator of the present embodiment will now be described with reference to FIGS. 5 to 7. FIGS. 5 to 7 show graphs showing respective temporal changes of the upward moving speed of the rod 5, the rotational position deviation of the rod 7, the operation signal, and the integral value of the speed controller 114.

FIG. 5 is a diagram showing an exemplary operation in a first comparative example. The operation of the first comparative example is an operation when a change in the proportional gain for shortening the takt time or the like is not made. When the pressing operation is completed, the operation signal changes from on to off and a raising command having the origin position as a position command value is given. At this time, the integral value is negative on the basis of the position deviation occurring in the pressing operation. Since a current value for generating the downward thrust force is calculated from the negative integral value, the movement of the rod 5 does not immediately start even when the raising command is given. After a certain period of time elapses, the negative integral value is canceled out and the movement of the rod 5 starts. When the rod 5 has risen to a predetermined position, the limitation on the moving speed and the thrust force is released such that the rod 5 rises at a high speed. A shake occurs in the rotational position of the rod 7 as the rod 5 accelerates. This is a shake (deviation) caused by the movement of the rod 7 rising together with the rod 5.

FIG. 6 is a diagram showing an exemplary operation in a second comparative example. The operation of the second comparative example is an operation when a change in the proportional gain for shortening the takt time is made. When the pressing operation is completed, the operation signal changes from on to off and a raising command having the origin position as a position command value is given. In the second comparative example, a proportional gain which is very great relative to the integral gain is given and, when the operation signal has switched from on to off, a current value calculated in proportion to the integral value has little influence on the current command. Therefore, when a raising command is given, a great upward thrust force is generated and the rod 5 starts moving at high speed, thus causing a shake in the rotational position of the rod 7. A positional displacement of the workpiece occurs since a shake occurs in the rotational position of the rod 7 before the suction pad 8 leaves the workpiece.

FIG. 7 is a diagram showing an exemplary operation in the present embodiment. The operation of the present embodiment is an operation when the integral value is corrected to shorten the takt time. When the pressing operation is completed, the operation signal changes from on to off and a raising command having the origin position as a position command value is given. At this time, the integral value of the speed controller 114 is changed to a correction value such that the integral value is updated with a value for generating a thrust force for holding the rod 5. This shortens the time until the movement of the rod 5 starts, compared to the operation shown in FIG. 5. When the rod 5 has risen to a predetermined position, the limitation on the moving speed and the thrust force is released such that the rod 5 rises at a high speed. A shake occurs in the rotational position of the rod 7 as the rod 5 accelerates. However, this causes no positional displacement in the workpiece since the suction pad 8 has already moved upward together with the rod 5, away from the workpiece.

As described above, according to the controller 100 of the present embodiment, it is possible to shorten the time until the upward movement of the rod 5 starts from the completion of the pressing operation without displacing the position of the attached workpiece, thus improving the responsiveness of the linear motor and shortening the takt time.

Correction of the integral value in the present embodiment can also be used for mass estimation in autotuning of the proportional gain, the integral gain and the differential gain in the control device 1 for the linear motor. In autotuning, mass estimation is generally performed before each gain adjustment. If the estimated mass coefficient is reflected, the current command value changes immediately after the reflection, thus failing to calculate an appropriate current command value, which may cause a positional displacement. In the correction of the integral value in the present embodiment, the integral value is adjusted such that the current command value does not change when the mass coefficient is reflected, thereby preventing the occurrence of a positional displacement.

When PI control or PID control based on a current command value and a current value provided to the linear motor is performed in the vertical axis driver 116 (the current controller) included in the control device 1 of the present embodiment, an integral value (a second integral value) of the integration operation in the vertical axis driver 116 may be stored in the correction value storage unit 117 as a second correction value in the same manner as in the speed controller 114. For example, when the vertical axis driver 116 calculates a voltage value by summing a value obtained by multiplying an integral value obtained by integrating a current deviation between a current command value and a current value flowing in the linear motor by an integral gain and a value obtained by multiplying the current deviation by a proportional gain, the integral value at the time when the rod 5 remains at the origin position is stored in the correction value storage unit 117 as the second correction value. In this case, the correction value storage unit 117 outputs the second correction value to the vertical axis driver 116 at the same timing as the timing of outputting the correction value to the speed controller 114, such that the integral value of the integration operation in the vertical axis driver 116 is updated with the second correction value. By correcting the integral value of the vertical axis driver 116, it is possible to further improve the responsiveness of the linear motor. Particularly, a higher responsiveness improvement can be expected in linear motors having a great electrical time constant since it takes time for them to generate a thrust force after current flows.

The present embodiment has been described with reference to the case in which the control device 1 is configured as a single device including the controller 100, the power supply 150, the vertical axis driver 116, and the rotational axis driver 126. However, the power supply 150 may he provided outside the control device 1.

Further, the present embodiment has been described with regard to the case in which the movable element of the linear motor of the linear motion device 2 moves in the vertical direction. However, the direction in which the movable element of the linear motor moves is not limited to the vertical direction, and the responsiveness of the linear motor can he improved using the control device 1 even when gravity or an external force acts along the direction in which the movable element moves. In addition, the present embodiment has been described with reference to the configuration in which the control device 1 updates the integral value in the integration operation with the correction value when the linear motor switches the thrust force applied to the movable element from a downward thrust force to an upward thrust force.

However, the control device 1 may update the integral value in the integration operation with the correction value even when the linear motor switches the thrust force applied to the movable element from the upward thrust force to the downward thrust force.

Further, the control device 1 described above may have a computer system therein. In this case, the steps of processing performed by the components included in the control device 1 are stored in a computer-readable recording medium in the form of a program and the processing of each of the functional components is performed by the computer reading and executing the program. Here, the computer-readable recording medium refers to a magnetic disk, a magneto-optical disk, a CD-ROM, a DVD-ROM, a semiconductor memory, or the like. The computer program may also be delivered to a computer through a communication line and may be executed by the computer which has received the program.

It is to be noted that the above embodiments are presented as examples and are not intended to limit the scope of the invention. These novel embodiments can be implemented in various other forms, and various omissions, substitutions, and changes can be made without departing from the scope of the invention. These embodiments and modifications thereof are included in the scope or gist of the invention, as well as in the scope of the invention described in the claims and their equivalents.

INDUSTRIAL APPLICABILITY

The present invention can also be applied to applications where it is indispensable to improve responsiveness even when an external force is generated.

REFERENCE SIGNS LIST

1 Control device
2 Linear motion device (linear motor)
4 Brake device
114 Speed controller
116 Vertical axis driver (current controller)
117 Correction value storage unit
131 Brake controller

The invention claimed is:
1. A control device for a linear motor, the control device comprising:
 a speed controller configured to calculate a current command value by an integration operation using a first integral value of a difference between a moving speed of a movable element provided in the linear motor and a speed command value calculated on the basis of a position command value;
 a current controller configured to apply a voltage to the linear motor on the basis of the current command value; and
 a correction value storage unit configured to store the first integral value of the speed controller when the movable element remains at a position indicated by the position command value,
 wherein the speed controller is configured to set the first integral value stored in the correction value storage unit as an initial value for the integration operation when resuming control of the linear motor, and wherein the speed controller is configured to set the first integral value stored in the correction value storage unit as the initial value for the integration operation when changing a direction in which to move the movable element.

2. The control device according to claim 1, further comprising a brake controller configured to control a brake device configured to brake the movable element of the linear motor, wherein the speed controller is configured to set the first integral value stored in the correction value storage unit as the initial value for the integration operation when resuming control of the linear motor before the brake controller turns off the brake device.

3. The control device according to claim 1, wherein the current controller is configured to calculate a voltage value to be applied to the linear motor by an integration operation using a second integral value of a difference between the current command value and a current value flowing in the linear motor, the correction value storage unit is configured to store the second integral value of the current controller when the movable element remains at a position indicated by the position command value, and the current controller is configured to set the second integral value stored in the correction value storage unit as the initial value for the integration operation when resuming control of the linear motor.

4. A control method performed by a control device for a linear motor, the control device including a speed controller configured to calculate a current command value by an integration operation using a first integral value of a difference between a moving speed of a movable element provided in the linear motor and a speed command value calculated on the basis of a position command value, and a current controller configured to apply a voltage to the linear motor on the basis of the current command value, the control method comprising:
a first step storing the first integral value of the speed controller when the movable element remains at a position indicated by the position command value; and
a second step setting the stored first integral value as an initial value for the integration operation in the speed controller when resuming control of the linear motor,
wherein the second step sets the stored first integral value as the initial value for the integration operation when changing a direction in which to move the movable element.

* * * * *